United States Patent
Wang et al.

(10) Patent No.: US 8,368,565 B2
(45) Date of Patent: Feb. 5, 2013

(54) POWER SAVING METHOD IN SLEEP MODE AND KEYBOARD CONTROLLER USING THE SAME

(75) Inventors: Horng-Bin Wang, Chiang-Hwa (TW); Hsin Chou Lee, Jhubei (TW)

(73) Assignee: Generalplus Technology Inc., Hsinchu (TW)

( * ) Notice: Subject to any disclaimer, the term of this patent is extended or adjusted under 35 U.S.C. 154(b) by 380 days.

(21) Appl. No.: 12/729,793

(22) Filed: Mar. 23, 2010

(65) Prior Publication Data

US 2010/0259424 A1 Oct. 14, 2010

(30) Foreign Application Priority Data

Apr. 14, 2009 (TW) .............................. 98112257 A

(51) Int. Cl.
*H03M 11/00* (2006.01)
(52) U.S. Cl. .......................................... 341/26; 341/20
(58) Field of Classification Search .................... 341/20, 341/22, 26; 400/62
See application file for complete search history.

(56) References Cited

U.S. PATENT DOCUMENTS

| | | | | |
|---|---|---|---|---|
| 5,790,054 A * | 8/1998 | Hsu et al. | ......................... | 341/22 |
| 6,040,788 A * | 3/2000 | Chambers et al. | .............. | 341/26 |
| 6,072,472 A * | 6/2000 | Shiga | ............................. | 345/168 |
| 6,198,820 B1 * | 3/2001 | Tetsushi | ........................ | 379/413 |
| 7,626,576 B2 * | 12/2009 | Anandakumar et al. | ...... | 345/173 |

* cited by examiner

*Primary Examiner* — Brian Young
(74) *Attorney, Agent, or Firm* — Muncy, Geissler, Olds & Lowe, PLLC

(57) ABSTRACT

The invention relates to a power saving method in a sleep mode and a keyboard controller using the same. The method is adapted for a triangular-type scan keyboard controller including a plurality of input/output (I/O) pins. The method includes the steps of: providing a first clock source and a second clock source, wherein the frequency of the second clock source is much lower than the frequency of the first clock source. In a normal mode, a scan pulse is sequentially outputted from the I/O pins according to the frequency of the first clock source. In a sleep mode, the scan pulse is sequentially outputted from the I/O pins according to the frequency of the second clock source. When a specific one of the I/O pins outputs the scan pulse, the other I/O pins are used for detecting.

11 Claims, 6 Drawing Sheets

POWER SAVING METHOD IN SLEEP MODE AND KEYBOARD CONTROLLER USING THE SAME

This application claims priority of No. 098112257 filed in Taiwan R.O.C. on Apr. 14, 2009 under 35 USC 119, the entire content of which is hereby incorporated by reference.

BACKGROUND OF THE INVENTION

1. Field of the Invention

The invention relates in general to the button control technology, and more particularly to a power saving method for a scan type keyboard.

2. Related Art

With the progress of the technology, the electronic technology has been developed from the earliest vacuum tubes and transistors to the integrated circuit chips, which have been widely used. Thus, electronic products have gradually become indispensable necessities in the daily life of the modern human beings. Many articles have been gradually electrized for the purpose of facilitating the convenience in using them.

Many control methods of the electronic products, such as computers, mobile phones and the like, often adopt the button control. Generally speaking, the methods of detecting the scanning of the keyboard buttons are classified into two kinds. The first kind is a matrix-type scan, and the second kind is a triangular-type scan. FIG. 1 is a schematic illustration showing the circuit of a conventional matrix-type scan keyboard. In this example, 5×5 keyboard keys will be illustrated. The circuit includes a matrix-type scan keyboard controller 100, five horizontal scan lines HS10 to HS14, and five vertical scan lines VS10 to VS14. The matrix-type scan keyboard controller 100 includes ten I/O pins I/O-10 to I/O-19.

When the keyboard button detection starts, the I/O pins I/O-10 to I/O-14 of the horizontal scan lines HS10 to HS14 are controlled to sequentially output scan pulses, and the I/O pins I/O-15 to I/O-19 of the vertical scan lines VS10 to VS14 are controlled to perform the detection. When the I/O pin I/O-10 outputs the scan pulse and the user presses a button 101, the horizontal scan line HS10 and the vertical scan line VS13 are short-circuited. Thus, the scan pulse is received by the I/O pin I/O-18. At this time, the matrix-type scan keyboard controller 100 can assert that the button 101 has been pressed.

FIG. 2 is a schematic illustration showing the circuit of a conventional triangular-type scan keyboard. Referring to FIG. 2, the circuit includes a triangular-type scan keyboard controller 200, nine vertical scan lines VS20 to VS28 and ten horizontal scan lines HS20 to HS29. Similarly, the triangular-type scan keyboard controller 200 includes ten I/O pins I/O-20 to I/O-29. When the keyboard button detection starts, the I/O pins I/O-20 to I/O-29 of the horizontal scan lines HS20 to HS29 are controlled to sequentially output the scan pulses. More particularly, when one of the I/O pins I/O-20 to I/O-29 outputs the scan pulse, the other remaining I/O pins I/O-20 to I/O-29 are used for detecting. For example, when the I/O pin I/O-20 outputs the scan pulse, the I/O pins I/O-21 to I/O-29 are used for detecting. Similarly, if the I/O pin I/O-21 outputs the scan pulse and a button 201 is pressed, the vertical scan line VS21 and the horizontal scan line HS24 are short-circuited. Thus, the scan pulse is received by the I/O pin I/O-24. The triangular-type scan keyboard controller 200 can assert that the button 201 has been pressed.

Compared FIG. 1 with FIG. 2, it is obtained that the triangular-type scan keyboard controller 200 having ten I/O pins can control 45 buttons, while the matrix-type scan keyboard controller 100 having ten I/O pins can control 25 buttons. In other words, under the consideration of the input/output (I/O) resources of the integrated circuit (IC), it is hoped to achieve more button control with the fewer I/O resources, and the control of the triangular-type scan keyboard can solve this problem.

The advantage of the matrix-type scan keyboard will be described in the following. When the matrix-type scan keyboard enters the sleep mode, as shown in FIG. 1, the I/O pins I/O-10 to I/O-14 are set to the logic high voltages, while the I/O pins I/O-15 to I/O-19 are set to the logic low voltages, and a register is used to record the logic states of the I/O pins I/O-15 to I/O-19. When the user presses any button, the logic high voltages of the I/O pins I/O-10 to I/O-14 are transferred to the I/O pins I/O-15 to I/O-19 such that the logic states of the I/O pins I/O-15 to I/O-19 are changed to wake up the matrix-type scan keyboard. Because the power consumption of the sleep mode is extremely low, it is suitable for the system with the low current consumption, such as a remote controller and the like.

However, the consumed current for the triangular-type scan keyboard control chip typically ranges from several hundreds of uA to several mA, which is still acceptable with respect to the system with the high current consumption. However, it is difficult for the triangular-type scan keyboard control chip to achieve this condition that the sleep current of the remote controller is limited to several uA. Thus, the triangular-type scan keyboard cannot be easily accepted by the user or the manufacturer.

SUMMARY OF THE INVENTION

It is therefore an objective of the invention to provide a power saving method in a sleep mode. The method is adapted for a triangular-type scan keyboard controller to achieve more button control with the fewer IO resources in the condition that the input/output resources are restricted, and to reduce the power consumption in the sleep mode.

Another objective of the invention is to provide a triangular-type scan keyboard and its controller using the method so that the keyboard or its controller has the low power consumption in the sleep mode.

The invention achieves the above-identified objectives by providing a power saving method in a sleep mode. The method is adapted for a triangular-type scan keyboard controller including a plurality of input/output (I/O) pins. The method includes the steps of: providing a first clock source; providing a second clock source, wherein a frequency of the second clock source is much lower than a frequency of the first clock source; sequentially outputting a scan pulse from the I/O pins according to the frequency of the first clock source in a normal mode, wherein when a specific one of the I/O pins outputs the scan pulse, the other I/O pins are used for detecting; and sequentially outputting the scan pulse from the I/O pins according to the frequency of the second clock source in the sleep mode. When a specific one of the I/O pins outputs the scan pulse, the other I/O pins are used for detecting.

In the power saving method according to the embodiment of the invention, the triangular-type scan keyboard controller further includes a scan driving unit and at least one function block. The scan driving unit drives the I/O pins to output the scan pulse, and the method further includes the step of: disabling the function blocks and only holding the scan driving unit in an operating state in the sleep mode. In addition, when a detected logic state of one of the I/O pins is changed in the sleep mode, the disabled function blocks are enabled to return to the normal mode in order to detect the pressed button.

In addition, the invention provides a triangular-type scan keyboard including the triangular-type scan keyboard controller, multiple horizontal scan lines, multiple vertical scan lines and multiple buttons. The triangular-type scan keyboard controller includes multiple I/O pins, a scan driving unit, a first clock source and a second clock source. The frequency of the second clock source is much lower than the frequency of the first clock source. The scan driving unit drives the I/O pins to output a scan pulse. The horizontal scan lines are correspondingly coupled to the I/O pins. The vertical scan lines are correspondingly coupled to the I/O pins except for one specific I/O pin. The horizontal scan lines intersect with the vertical scan lines. Each horizontal scan line and each vertical scan line are open-circuited. The buttons are respectively disposed at intersections between the horizontal scan lines and the vertical scan lines. When a specific button disposed at the intersection between a specific horizontal scan line and a specific vertical scan line is pressed, the specific horizontal scan line and the specific vertical scan line are short-circuited.

When the triangular-type scan keyboard controller is in the normal mode, the scan pulse is sequentially outputted from the I/O pins according to the frequency of the first clock source. When a specific one of the I/O pins outputs the scan pulse, the other I/O pins are used for detecting. When the triangular-type scan keyboard controller is in the sleep mode, the scan pulse is sequentially outputted from the I/O pins according to the frequency of the second clock source. When a specific one of the I/O pins outputs the scan pulse, the other I/O pins are used for detecting.

The triangular-type scan keyboard controller according to the embodiment of the invention further includes at least one function block, which is disabled in the sleep mode. In addition, when a button has not been pressed for a period of time, the sleep mode is entered, and the frequency of the clock signal of the second clock source is lower than 10 KHz.

The essence of the invention is to use a triangular scan keyboard controller built with two system clock sources including one clock source with the higher frequency, such as the frequency of the MHz level, applied to the normal operation mode, and the other clock source with the frequency of the KHz level applied to the sleep (low speed, power-saving) mode. When the triangular scan keyboard controller enters the sleep (low speed, power-saving) mode, other function blocks of the controller, except for a portion of the circuit of the I/O pin, enter the sleep mode. The I/O pins continuously perform the keyboard scan according to the clock signal having the low frequency, such as the frequency of the KHz level. The microprocessor and other function blocks are woken up only when the states of the I/O pins are changed. Next, the microprocessor checks the button being actuated and then performs the subsequent functional operation.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
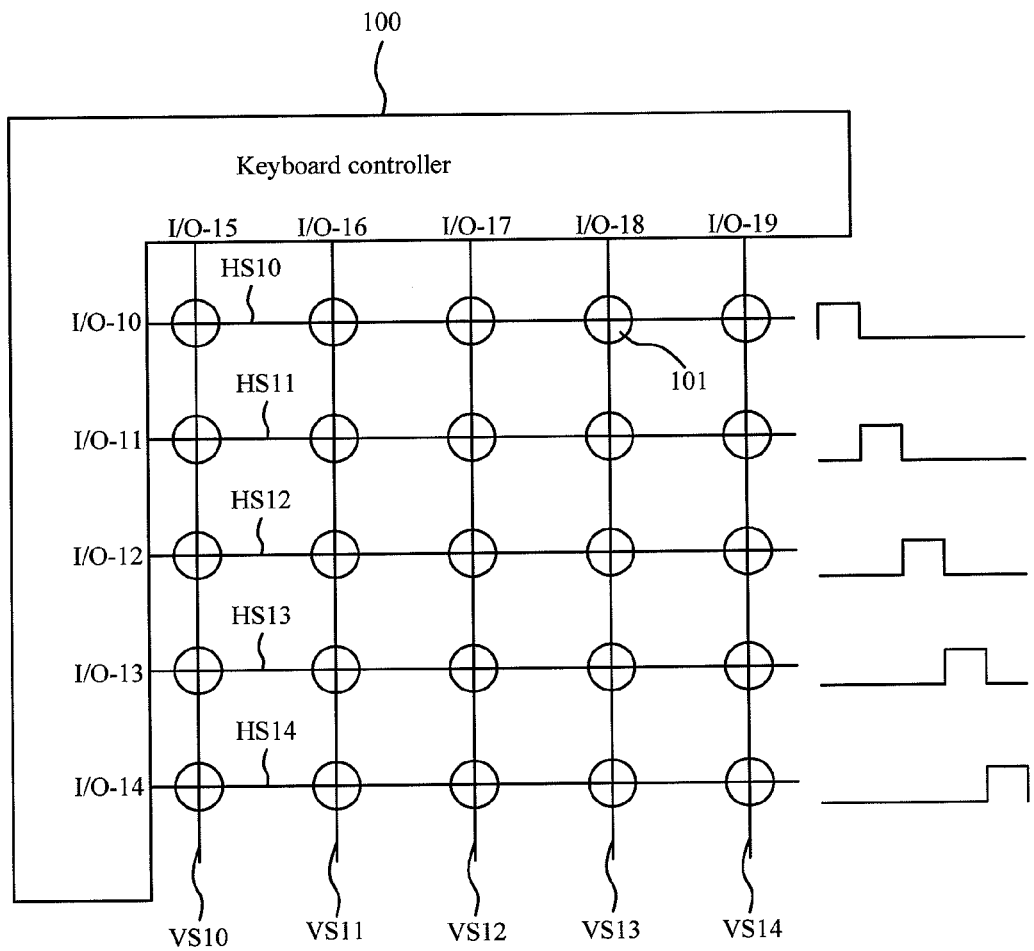
FIG. 1 is a schematic illustration showing the circuit of a conventional matrix-type scan keyboard.
Figure 2:
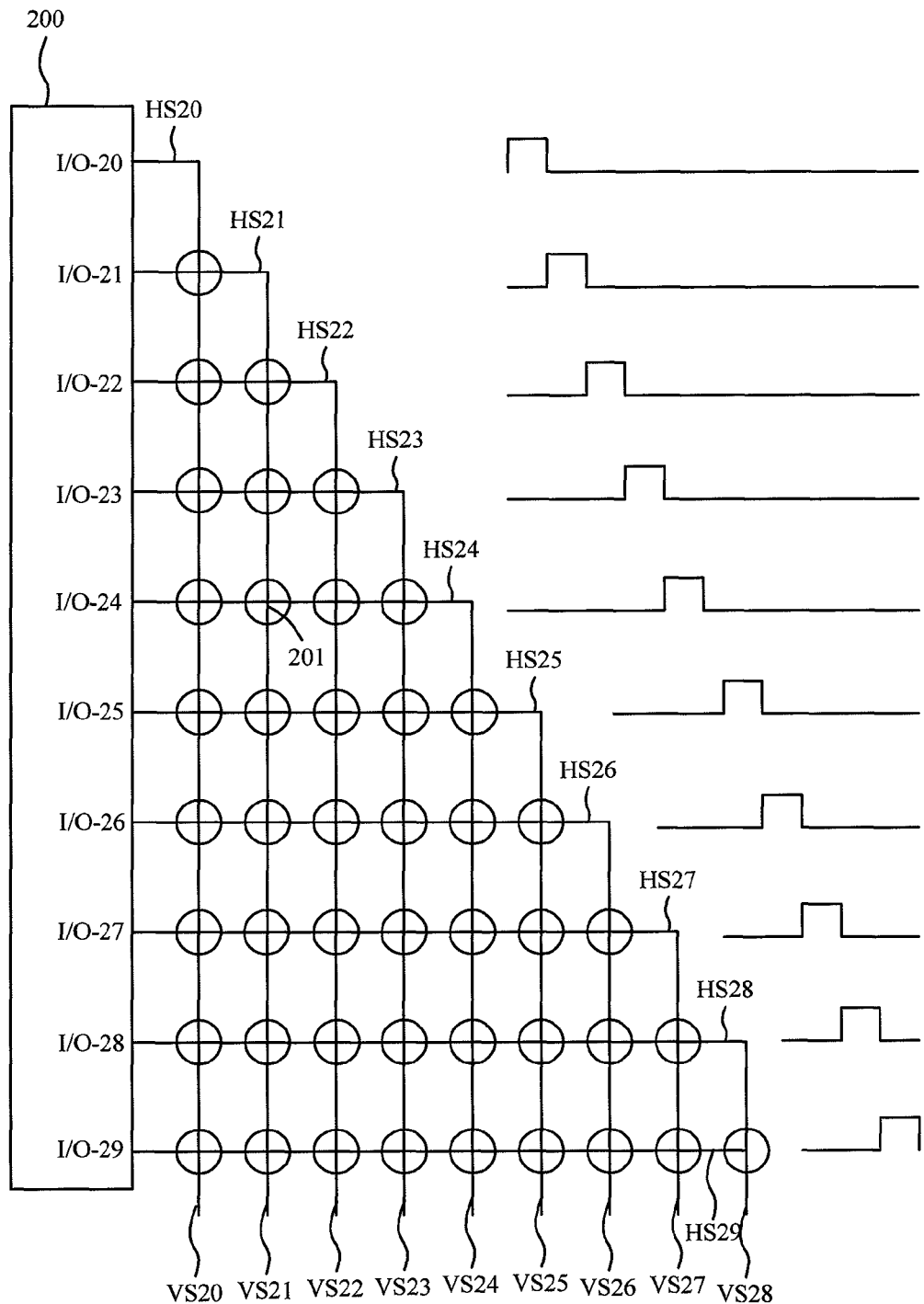
FIG. 2 is a schematic illustration showing the circuit of a conventional triangular-type scan keyboard.
Figure 3:
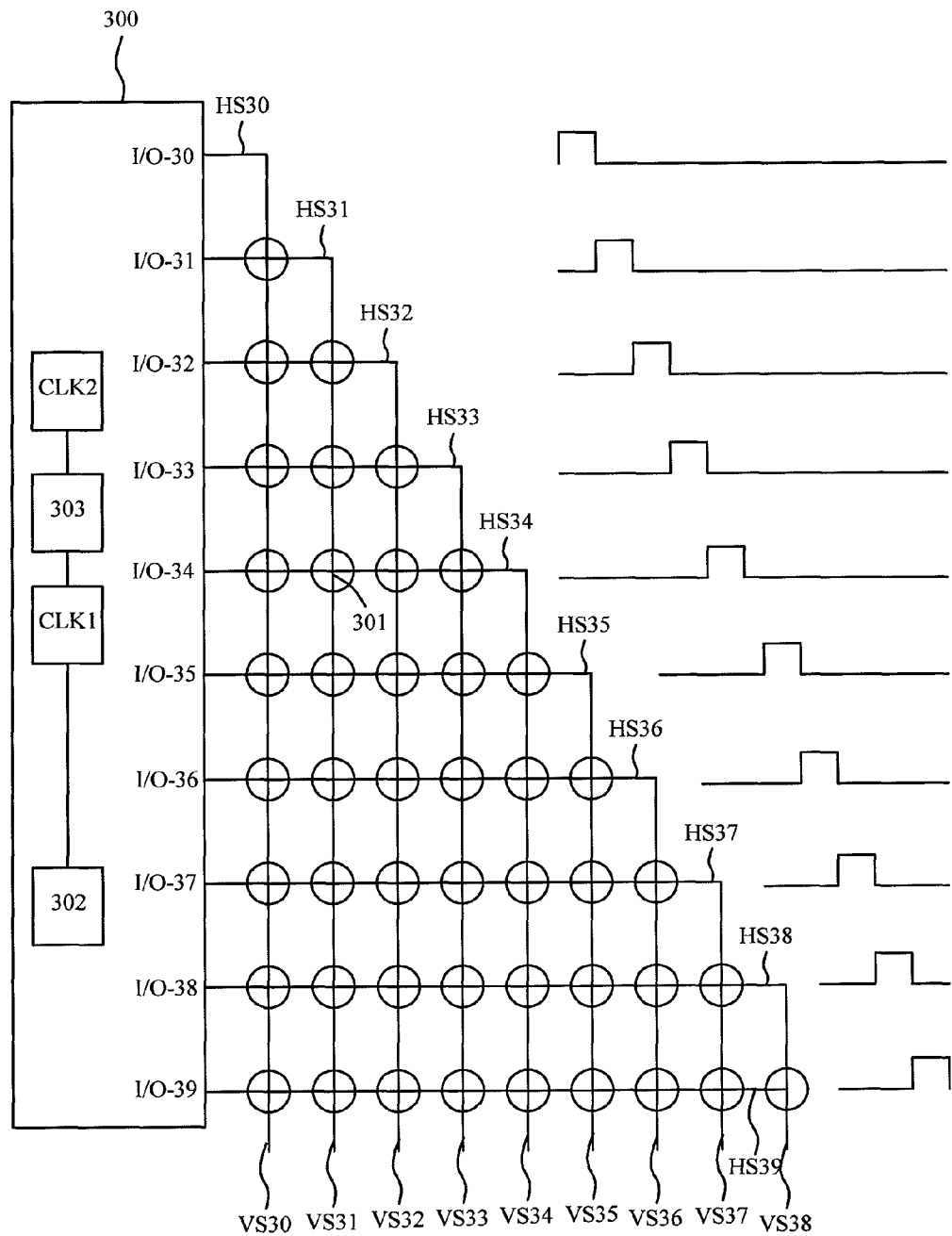
FIG. 3 is a block diagram showing the circuit of a triangular-type scan keyboard according to an embodiment of the invention.

FIG. 3 is a block diagram showing the circuit of a triangular-type scan keyboard according to an embodiment of the invention. Referring to FIG. 3, the triangular-type scan keyboard includes nine vertical scan lines VS30 to VS38, ten horizontal scan lines HS30 to HS39, a triangular-type scan keyboard controller 300 and multiple buttons 301. The triangular-type scan keyboard controller 300 includes ten I/O pins I/O-30 to I/O-39, a function block 302, a scan driving unit 303, a first clock source CLK1 and a second clock source CLK2. In this embodiment, both the first clock source CLK1 and the second clock source CLK2 provide clock signals to the scan driving unit 303. The scan driving unit 303 is used for driving the pulses outputted from the I/O pins I/O-30 to I/O-39.

The first clock source CLK1 and the second clock source CLK2 determine the frequency of the pulse outputted from each of the I/O pins I/O-30 to I/O-39 in different modes, respectively. More particularly, the frequency of the clock signal outputted from the second clock source CLK2 is much lower than the frequency of the clock signal outputted from the first clock source CLK1. The first clock source CLK1 supplies the clock signal required in the normal mode. The second clock source CLK2 supplies the clock signal required in the sleep mode. Generally speaking, the frequency of the clock signal outputted from the first clock source CLK1 is at the MHz level, and the frequency of the clock signal outputted from the second clock source CLK2 is at the KHz level.

In the normal mode, the triangular-type scan keyboard controller 300 firstly controls the I/O pin I/O-30 to output a scan pulse according to the clock signal outputted from the first clock source CLK1. At this time, other I/O pins I/O-31 to I/O-39 are used for detecting the buttons on the vertical scan line VS30. Next, the triangular-type scan keyboard controller 300 controls the I/O pin I/O-31 to output a scan pulse according to the clock signal outputted from the first clock source CLK1. At this time, the other I/O pins I/O-32 to I/O-39 are used for detecting the buttons on the vertical scan line VS31, and so on. In brief, when one of the I/O pins I/O-30 to I/O-39 outputs the scan pulse, the other remaining I/O pins I/O-30 to I/O-39 perform the button detection. For example, if the I/O pin I/O-31 outputs the scan pulse and when the button 301 is pressed, the vertical scan line VS31 and the horizontal scan line HS34 are short-circuited. Thus, the scan pulse is received by the I/O pin I/O-34. The triangular-type scan keyboard controller 300 can assert that the button 301 has been pressed. At this time, the function block 302 performs the corresponding operation according to the pressed button.

When the user has not operated the keyboard for a period of time, the triangular-type scan keyboard controller 300 starts to enter the sleep mode. In the sleep mode, the triangular-type scan keyboard controller 300 disables the function block 302 and the first clock source CLK1 is replaced with the second clock source CLK2. The scan driving unit 303 drives the I/O pins I/O-30 to I/O-39 to output the scan pulses according to the clock signal of the second clock source CLK2. Because the button is not pressed, the state of each of the I/O pins I/O-30 to I/O-39 should be held at the logic low voltage. Because the function block 302 is disabled, it is impossible to assert which button has been pressed although the button scanning is still being performed.

For example, if the I/O pin I/O-31 outputs the scan pulse and when the button 301 is pressed, the vertical scan line VS31 and the horizontal scan line HS34 are short-circuited. Thus, the scan pulse is received by the I/O pin I/O-34. After the I/O pin I/O-34 receives the logic high voltage of the scan pulse, the triangular-type scan keyboard controller 300 is woken up and changed to the normal mode. That is, the function block 302 is enabled, and the second clock source CLK2 is replaced with the first clock source CLK1. At this time, the scanning process is performed again to assert the pressed button 301 according to the frequency of the first clock source CLK1.

Because the embodiment adopts the second clock source CLK2 in the sleep mode, the second clock source CLK2 typically outputs the clock lower than 10 KHz, preferably the clock at the KHz level. In addition, the function block 302 is disabled in the sleep mode. Thus, the dynamic power consumption is reduced, and the current consumption of the triangular-type scan keyboard controller 300 in the sleep mode may be reduced to be lower than several uA.

In addition to the above-mentioned condition that the button has not been pressed for a long time, another condition that the button has been pressed for a long time also exists. For example, when the remote controller is pressed by the hip and has not been found, this condition causes the remote controller to continuously emit signals. After a long time, the electrical power is completely consumed. The typical keyboard controller also does not have such a design for the power-saving mode in this condition. However, the power-saving effect still can be achieved according to the embodiment of the invention. In the following, illustrations will be made according to the condition that the button 301 has been pressed, wherein the sleep mode is entered to save the power consumption to prevent the electrical power from being used up due to the continuous pressing of the button 301.

First, when the period of time for which the button 301 is pressed exceeds a predetermined period of time, the triangular-type scan keyboard controller 300 enters the sleep mode. Similarly, only the operation state of the scan driving unit 303 is held, and the other function block 302 is disabled. Similarly, the scan driving unit 303 drives the I/O pins I/O-30 to I/O-39 to output the scan pulses according to the clock signal of the second clock source CLK2. Because the button 301 is pressed, the triangular-type scan keyboard controller 300 only needs to judge whether the button has been released in the sleep mode. Therefore, the frequency of the second clock source CLK2 needs not reach the KHz level mentioned hereinabove, and only the clock signal with the frequency lower than 100 Hz is required. Preferably, the clock signal has the frequency at the Hz level. In this example, the triangular-type scan keyboard controller 300 only needs to judge whether the I/O pin I/O-34 receives the logic low voltage when the I/O pin I/O-31 outputs the scan pulse in the sleep mode. If the I/O pin I/O-34 receives the logic low voltage when the I/O pin I/O-31 outputs the scan pulse, it represents that the button 301 has been released, and the normal mode is entered. If the I/O pin I/O-34 still receives the logic high voltage when the I/O pin I/O-31 outputs the scan pulse, it represents that the button 301 is still pressed, and the sleep mode is still held.

Figure 4A:
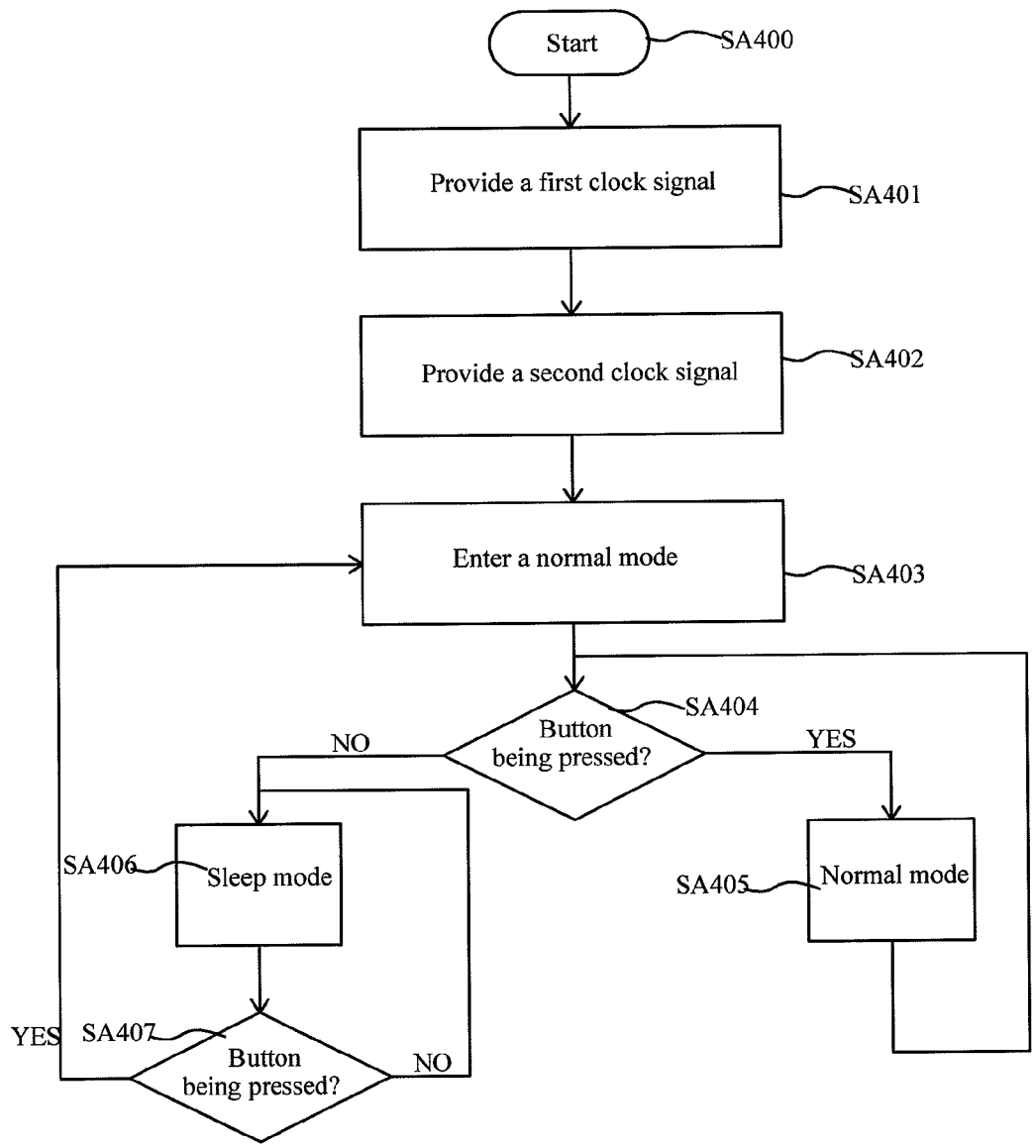
FIG. 4A is a flow chart showing a power saving method in a sleep mode according to an embodiment of the invention.

According to the above-mentioned embodiment, the invention additionally provides a power saving method in the sleep mode. The method is adapted for a triangular-type scan keyboard controller. FIG. 4A is a flow chart showing a power saving method in a sleep mode according to an embodiment of the invention. As shown in FIG. 4A, this method is adopted to the condition that all the buttons have not been pressed for a period of time. The method includes the following steps.

In step SA400, the power saving method starts.

In step SA401, a first clock source is provided.

In step SA402, a second clock source is provided, wherein the frequency of the second clock source is much lower than the frequency of the first clock source.

In step SA403, the normal mode is entered. The scan pulse is sequentially outputted from the I/O pins according to the frequency of the first clock source. When a specific one of the I/O pins outputs the scan pulse, the other I/O pins are used for detecting.

In step SA404, it is judged whether no button has been pressed within a predetermined period of time. If the button is pressed, step SA405 is performed. If no button has been pressed, step SA406 is performed.

In the step SA405, the normal mode is held.

In the step SA406, the sleep mode is entered, and the scan pulse is sequentially outputted from the I/O pins according to the frequency of the second clock source. When a specific one of the I/O pins outputs the scan pulse, the other I/O pins are used for detecting.

In step SA407, it is judged whether a button is pressed. If the button is pressed, the procedure goes back to the step SA403. If no button is pressed, the procedure goes back to the step SA406, and the sleep mode is still held.

Figure 4B:
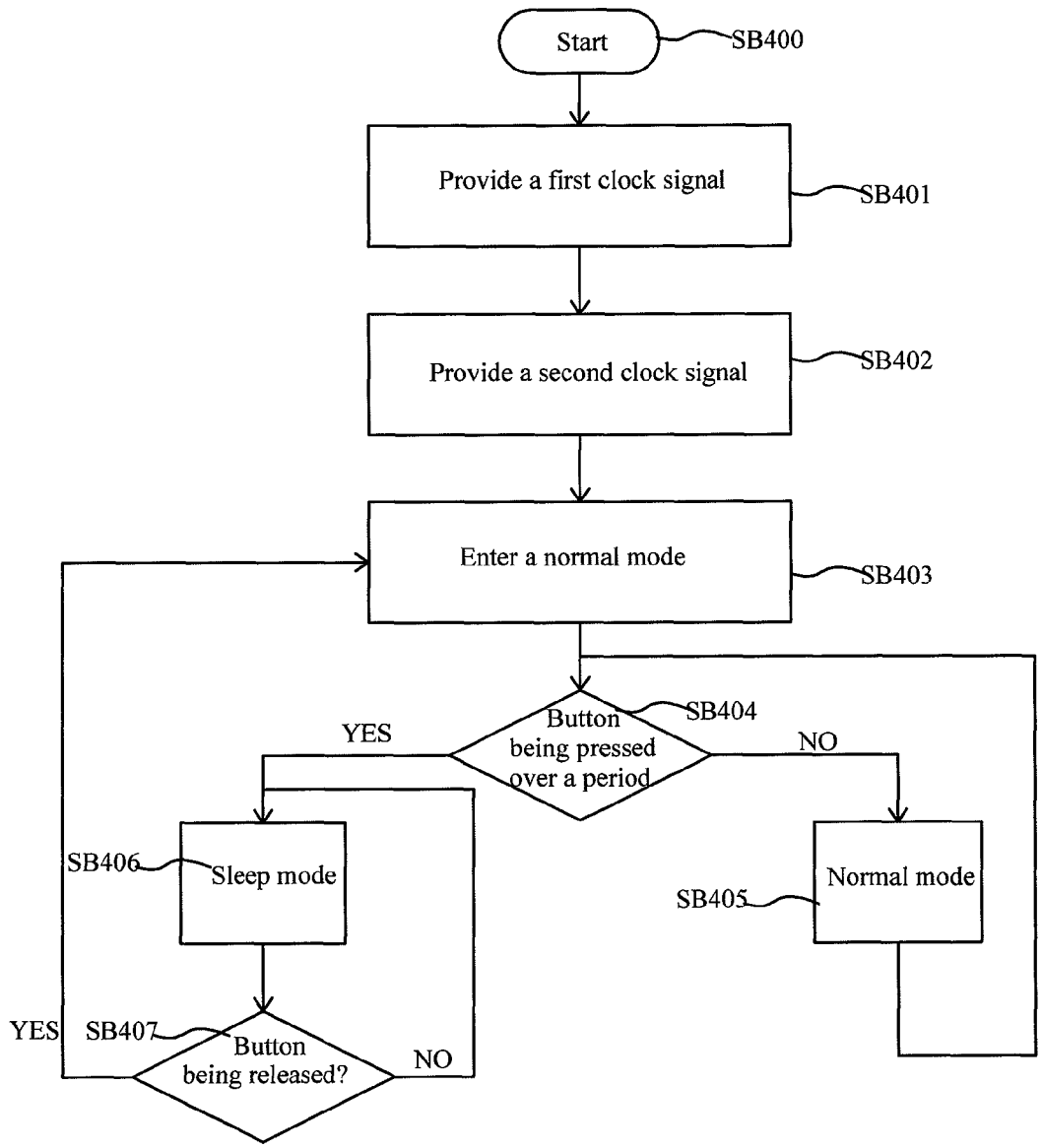
FIG. 4B is a flow chart showing the power saving method in the sleep mode according to the embodiment of the invention.

FIG. 4B is a flow chart showing the power saving method in the sleep mode according to the embodiment of the invention. Referring to FIG. 4B, this method is applied to the condition that a button has been pressed for a period of time. The method includes the following steps.

In step SB400, the power saving method starts.

In step SB401, a first clock source is provided.

In step SB402, a second clock source is provided. The frequency of the second clock source is much lower than the frequency of the first clock source.

In step SB403, the normal mode is entered. The scan pulse is sequentially outputted from the I/O pins according to the frequency of the first clock source. When a specific one of the I/O pins outputs the scan pulse, the other I/O pins are used for detecting.

In step SB404, it is judged whether or not the same one button has been pressed for a period of time exceeding a predetermined period of time. When the judged result is negative, the step SB405 is entered. When the judged result is affirmative, the step SB406 is entered.

In step SB405, the normal mode is held.

In step SB406, the sleep mode is entered. And the second clock source is used to replace the first clock source. In comparison with the embodiment depicted in FIG. 4A, since the button is pressed, the triangular-type scan keyboard controller 300 only needs to judge whether the button has been released in the sleep mode. Therefore, the frequency of the second clock source needs not reach the KHz level mentioned hereinabove, and only the clock signal with the frequency lower than 100 Hz is required. Preferably, the clock signal has the frequency at the Hz level.

In step SB407, it is judged whether the button has been released. If the pressed button is released (the judged result is affirmative), the procedure goes back to the step SB403 and the normal mode is entered. If the pressed button is still continuously pressed (the judged result is negative), the procedure goes back to the step SB406 and the sleep mode is held.

Figure 5:
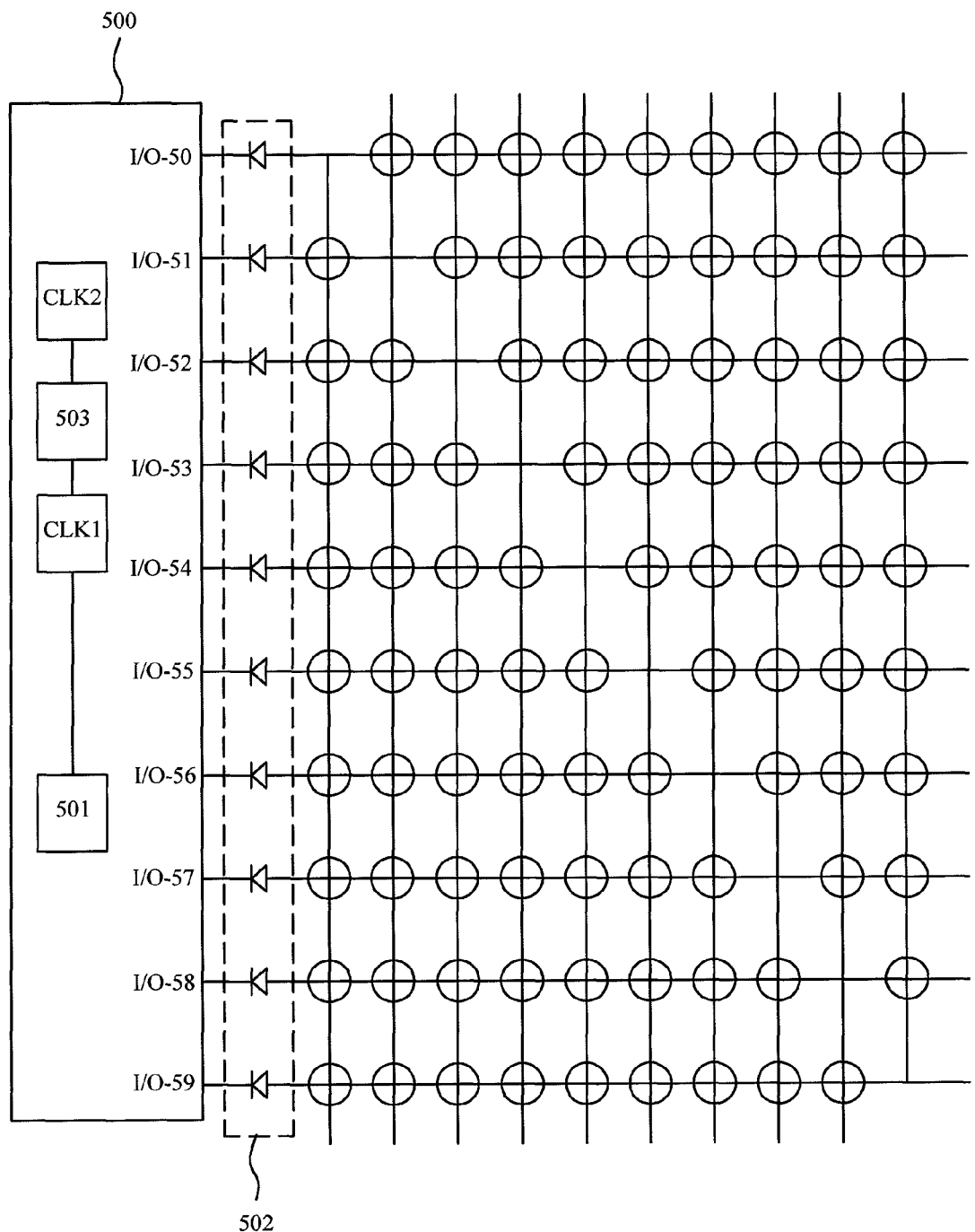
FIG. 5 is a block diagram showing the circuit of the triangular-type scan keyboard according to the embodiment of the invention.

In addition, although the embodiment only provides the circuit of the triangular-type scan keyboard of FIG. 3, those skilled in the art should know that the above-mentioned circuit is a semi-matrix type circuit. FIG. 5 is a block diagram showing the circuit of the triangular-type scan keyboard according to the embodiment of the invention. As shown in FIG. 5, the circuit is a full-matrix type triangular-type scan keyboard circuit. The triangular-type scan keyboard controller 500 includes a function block 501, a scan driving unit 503, multiple I/O pins IO-50 to IO59, a first clock source CLK1 and a second clock source CLK2, and further includes multiple diodes 502. Because this control method is the same as the principle of the triangular-type scan keyboard circuit of FIG. 3, detailed descriptions thereof will be omitted.

In summary, the essence of the invention is to use a triangular scan keyboard controller built with two system clock sources including one clock source with the higher frequency, such as the frequency of the MHz level, applied to the normal operation mode, and the other clock source with the frequency of the KHz level applied to the sleep (low speed, power-saving) mode. When the triangular scan keyboard controller enters the sleep (low speed, power-saving) mode, other function blocks of the controller, except for a portion of the circuit of the I/O pin, enter the sleep mode. The I/O pins continuously perform the keyboard scan according to the clock signal having the low frequency, such as the frequency of the KHz level. The microprocessor and other function blocks are woken up only when the states of the I/O pins are changed. Next, the microprocessor checks the button being actuated and then performs the subsequent functional operation.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A power saving method in a sleep mode, the method being adapted for a triangular-type scan keyboard controller comprising a plurality of input/output (I/O) pins, the method comprising the steps of:
   providing a first clock source;
   providing a second clock source;
   sequentially outputting a scan pulse from the I/O pins according to the frequency of the first clock source in a normal mode, wherein when a specific one of the I/O pins outputs the scan pulse, the other I/O pins are used for detecting; and
   sequentially outputting the scan pulse from the I/O pins according to the frequency of the second clock source in the sleep mode, wherein when a specific one of the I/O pins outputs the scan pulse, the other I/O pins are used for detecting,
   wherein the triangular-type scan keyboard controller further comprises a scan driving unit and at least one function block, wherein the scan driving unit drives the I/O pins to output the scan pulse, and the method further comprises the step of:
   disabling the function block and only holding the scan driving unit in an operating state in the sleep mode.

2. The method according to claim 1, further comprising, in the sleep mode, the step of:
   enabling the disabled function block to return to the normal mode when a detected logic state of one of the I/O pins is changed.

3. The method according to claim 1, further comprising, in the normal mode, the steps of:
   judging whether a button has not been pressed for a period of time; and
   entering the sleep mode when the button has not been pressed for the period of time.

4. The method according to claim 1, further comprising, in the normal mode, the steps of:
   judging whether a button has been continuously pressed for a period of time; and
   entering the sleep mode when the button has been continuously pressed for the period of time.

5. A triangular-type scan keyboard controller, comprising:
   a plurality of input/output (I/O) pins;
   a scan driving unit for driving the I/O pins to output a scan pulse;
   a first clock source for providing a first clock signal to the scan driving unit; and
   a second clock source for providing a second clock signal to the scan driving unit, wherein a frequency of the second clock signal is much lower than a frequency of the first clock signal;
   at least one function block, which is disabled in the sleep mode, wherein:
   when the triangular-type scan keyboard controller is in a normal mode, the scan pulse is sequentially outputted from the I/O pins according to the frequency of the first clock, and when a specific one of the I/O pins outputs the scan pulse, the other I/O pins are used for detecting;
   when the triangular-type scan keyboard controller is in a sleep mode, the scan pulse is sequentially outputted from the I/O pins according to the frequency of the second clock, and when a specific one of the I/O pins outputs the scan pulse, the other I/O pins are used for detecting;
   wherein when the triangular-type scan keyboard controller is in a sleep mode, the scan driving unit is only held in an operating state.

6. The keyboard controller according to claim 5, wherein when a button has not been pressed for a period of time, the sleep mode is entered, and the frequency of the second clock signal of the second clock source is lower than 10 KHz.

7. The keyboard controller according to claim 5, wherein when a button is continuously pressed for a period of time, the sleep mode is entered, and the frequency of the second clock signal of the second clock source is lower than 10 Hz.

8. A triangular-type scan keyboard, comprising:
   a plurality of horizontal scan lines correspondingly coupled to a plurality of input/output (I/O) pins;
   a plurality of vertical scan lines correspondingly coupled to the I/O pins except for at least one of the I/O pins, wherein the horizontal scan lines intersect with the vertical scan lines, and each of the horizontal scan lines and each of the vertical scan lines are open-circuited;

a plurality of buttons disposed at intersections between the horizontal scan lines and the vertical scan lines, wherein when a specific one of the buttons disposed at the intersection between a specific horizontal scan line of the horizontal scan lines and a specific vertical scan line of the vertical scan lines is pressed, the specific horizontal scan line and the specific vertical scan line are short-circuited;

a triangular-type scan keyboard controller, which comprises:

a plurality of input/output (I/O) pins;

a scan driving unit for driving the I/O pins to output a scan pulse;

a first clock source for providing a first clock signal to the scan driving unit; and a second clock source for providing a second clock signal to the scan driving unit, wherein a frequency of the second clock signal is much lower than a frequency of the first clock signal, wherein:

when the triangular-type scan keyboard controller is in a normal mode, the scan pulse is sequentially outputted from the I/O pins according to the frequency of the first clock, and when a specific one of the I/O pins outputs the scan pulse, the other I/O pins are used for detecting; and when the triangular-type scan keyboard controller is in a sleep mode, the scan pulse is sequentially outputted from the I/O pins according to the frequency of the second clock, and when a specific one of the I/O pins outputs the scan pulse, the other I/O pins are used for detecting.

9. The keyboard according to claim 8, further comprising:

at least one function block, which is disabled in the sleep mode.

10. The keyboard according to claim 8, wherein when a button has not been pressed for a period of time, the sleep mode is entered, and the frequency of the second clock signal of the second clock source is lower than 10 KHz.

11. The keyboard according to claim 8, wherein when a button is continuously pressed for a period of time, the sleep mode is entered, and the frequency of the second clock signal of the second clock source is lower than 10 Hz.

* * * * *